(12) United States Patent
Huang

(10) Patent No.: US 6,643,131 B1
(45) Date of Patent: Nov. 4, 2003

(54) WIND GUIDE DEVICE FOR CPU COOLER

(75) Inventor: Meng-Chou Huang, Taipei Hsien (TW)

(73) Assignee: First International Computer, Inc., Taiwan (TW)

( * ) Notice: Subject to any disclaimer, the term of this patent is extended or adjusted under 35 U.S.C. 154(b) by 0 days.

(21) Appl. No.: 10/267,595

(22) Filed: Oct. 10, 2002

(51) Int. Cl.⁷ ................................................ H05K 7/20
(52) U.S. Cl. ...................... 361/697; 165/121; 361/703; 454/184
(58) Field of Search .................... 165/121–126, 165/80.3, 185; 454/184; 312/236; 415/177, 178, 213.1, 214.1; 257/722; 361/687, 695, 697, 703, 709–712, 717–720; 174/16.3

(56) References Cited

U.S. PATENT DOCUMENTS 5,828,549 A * 10/1998 Gandre et al. .............. 361/695
6,538,888 B1 * 3/2003 Wei et al. ................... 361/697

* cited by examiner

Primary Examiner—Gerald Tolin
(74) Attorney, Agent, or Firm—Bacon & Thomas PLLC

(57) ABSTRACT

The present invention is to provide a wind guide device for a cooling fan mounted on a CPU of a computer comprising a first shroud and a second shroud. A first opening at one side of the first shroud having the fan mounted thereon is coupled to a vent opening on a housing of the computer for convection. A first opening at one side of the second shroud is coupled to a second opening at the other side of the first shroud to form an upper air passage and a lower air passage. Fins on one side of the CPU are partially enclosed by an L-shaped frame element extended from the second shroud so as to cause an air current generated by the fan to accelerate through the upper and lower air passages for cooling the CPU and other electronic elements therearound.

9 Claims, 3 Drawing Sheets

WIND GUIDE DEVICE FOR CPU COOLER

FIELD OF THE INVENTION

The present invention relates to a cooler for a central processing unit (CPU) of computer and more particularly to a wind guide device for CPU cooler with improved characteristics.

BACKGROUND OF THE INVENTION

It is known that a CPU and other electronic elements of a computer may generate heat as the computer is operating. In the past such heat especially generated by the CPU is not high due to a relatively slow speed thereof. Hence, a cooler (e.g., fan) mounted on the CPU is sufficient to effectively cool the CPU by means of convection. As such, a surface temperature of the CPU can be reduced to a safe value below a maximum operating temperature. It is also known that heat generated by the CPU becomes larger as speed of the CPU becomes faster. One proposed solution for lowering heat of the CPU is by mounting a second fan thereon. It is desired that such dual fan arrangement can either drive out heat generated by the CPU and the other electronic elements of computer or draw cool air from outside onto the same. It is desired that the CPU and the other electronic elements of a running computer can be effectively cooled. However, a disadvantage has been found. For example, a typical fan mounted in the CPU has a width of only 40 mm, 50 mm, or 60 mm. Also, the smaller of fan the higher of difficulty and cost in manufacturing.

In view of the above, only a small cooling fan can be mounted on the CPU within a housing of computer due to a limited space. It not only increases cost but also increases noise. Further, a sufficient amount of air current cannot be set up by the cooling fan in operation. Thus, a satisfactory heat cooling effect is not obtainable. To the worse, a noisy computer does not meet the trend of environmental protection. Thus improvement exists.

SUMMARY OF THE INVENTION

A primary object of the present invention is to provide a wind guide device for a cooling fan mounted on a CPU of a computer comprising a first shroud and a second shroud. A first opening at one side of the first shroud having the fan mounted thereon is coupled to a vent opening on a housing of the computer for convection. A first opening at one side of the second shroud is coupled to a second opening at the other side of the first shroud by fastening mating coupling elements and mating snapping elements of the second shroud onto coupling elements and snapping elements at the second opening of the first shroud. Thus, an upper air passage and a lower air passage are formed. Fins on one side of the CPU are partially enclosed by an L-shaped frame element extended from the second shroud so as to cause an air current generated by the fan to accelerate through the upper and lower air passages for cooling the CPU and other electronic elements thereraround. Such double arrangement of the upper and the lower air passages can significantly increase a cooling effect of the CPU and the other electronic elements as compared with the prior art.

Another object of the present invention is to provide a wind guide device for a cooling fan mounted on a CPU of a computer wherein the first shroud further comprises a plurality of rib members across the second opening thereof to form a plurality of first channels and the second shroud further comprises a plurality of ribs across the second opening thereof to form a plurality of second channels, the ribs being disposed corresponding to the rib members. Thus, it is possible of concentrating the air current in the first shroud and guiding and hastening the air current generated by the fan at one side of the first shroud through the channels.

The above and other objects, features and advantages of the present invention will become apparent from the following detailed description taken with the accompanying drawings.

DETAILED DESCRIPTION OF THE PREFERRED EMBODIMENTS

Figure 1:
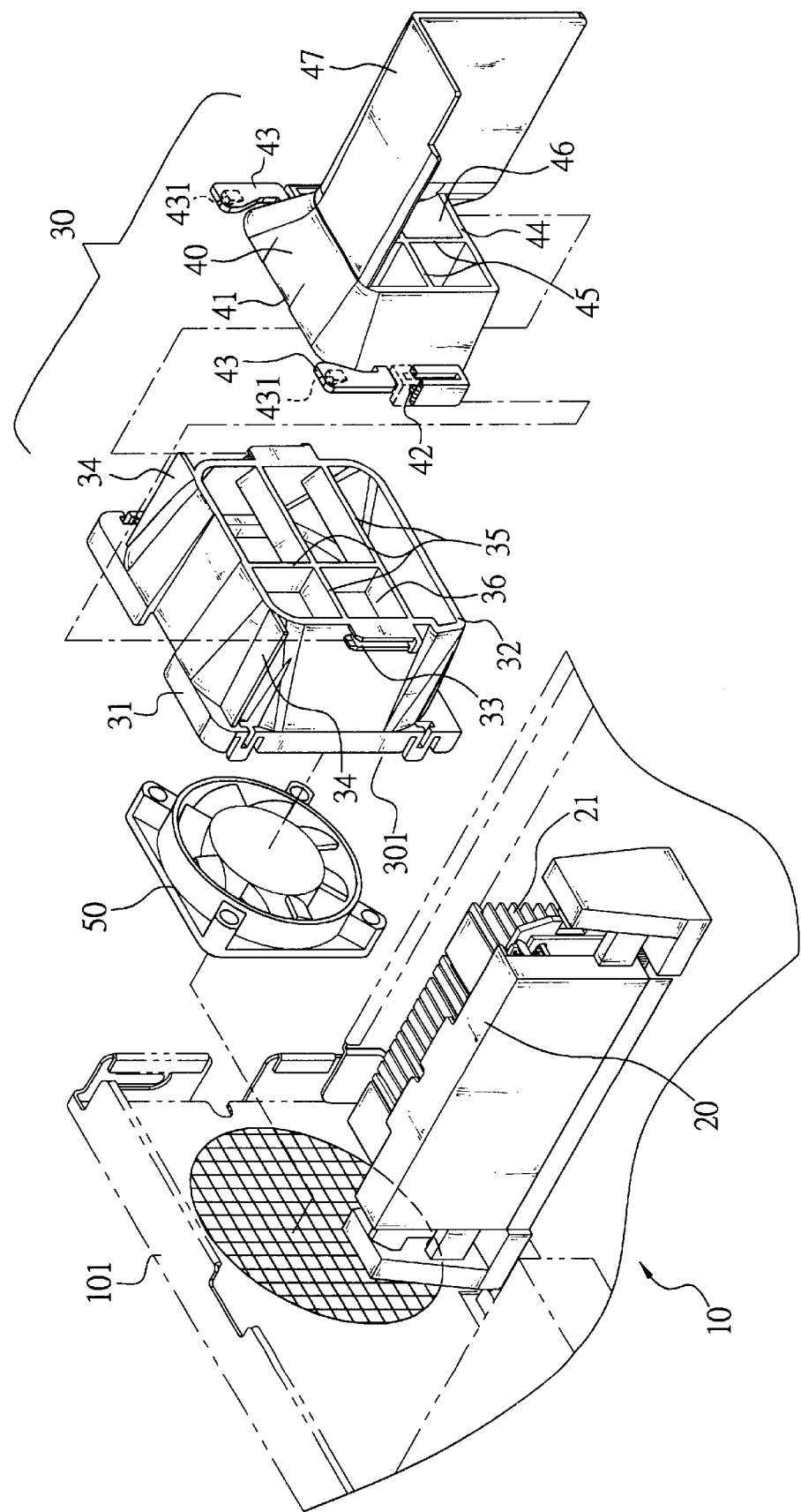
FIG. 1 is an exploded view of a wind guide device for CPU cooler according to a preferred embodiment of the invention.
Figure 2:
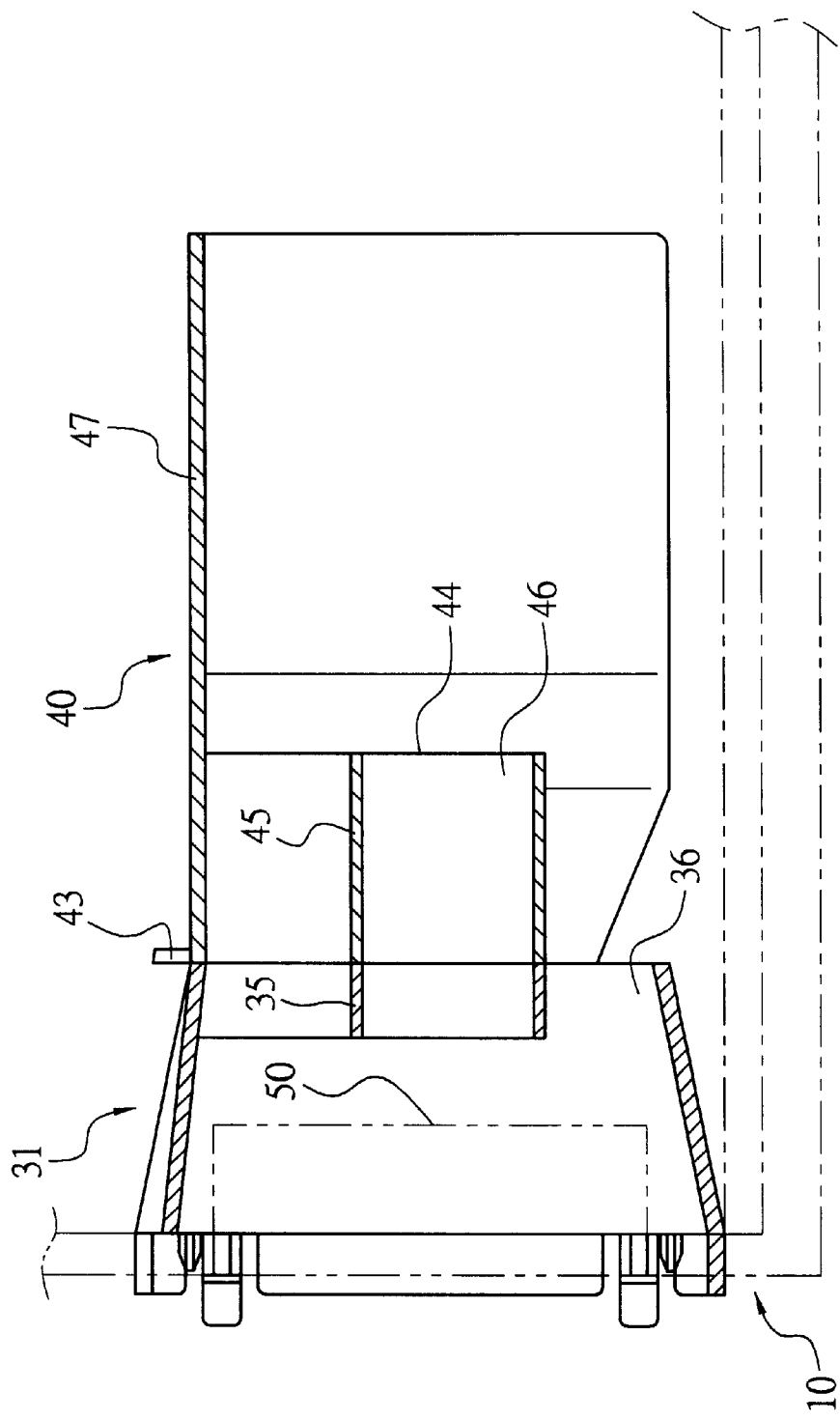
FIG. 2 is a cross-sectional view of the assembled device and fan.
Figure 3:
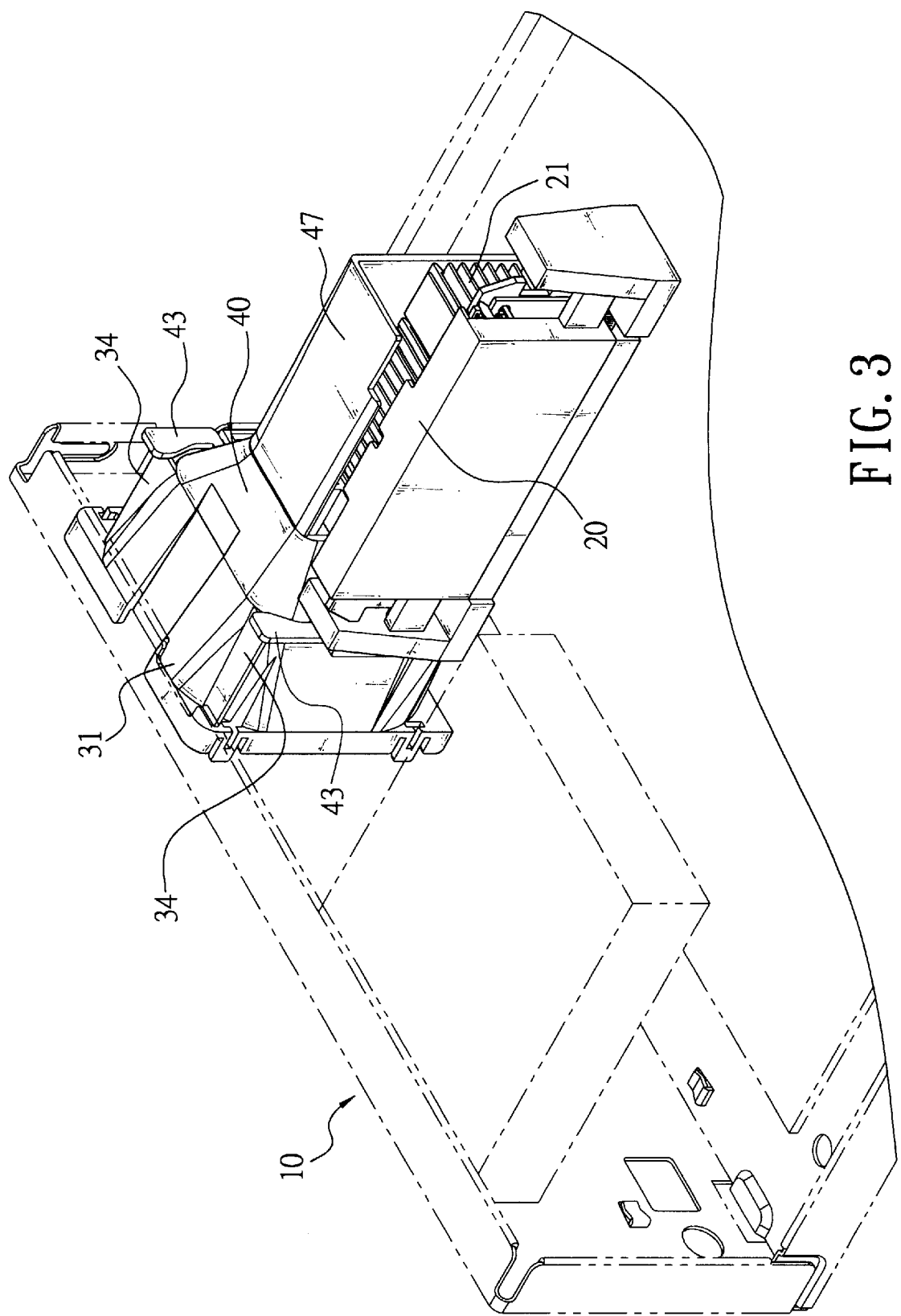
FIG. 3 is a perspective view of the device assembled with the CPU and the fan within a housing of computer.

Referring to FIGS. 1, 2 and 3, there is shown a wind guide device 30 for a CPU cooler 50 (e.g., fan) in accordance with the invention. The device 30 and a CPU 20 are provided in a housing 10 of computer. The device 30 is designed to enhance a cooling of the CPU 20. A vent opening 101 is formed on a rear side of the housing 10. A first opening 301 is formed at one side of the device 30 corresponding to the vent opening 101. As such, a convection between the first opening 301 and the vent opening 101 is made possible (see FIGS. 1 and 3).

In the invention, the device 30 comprises a first shroud 31 having a section of substantially square (FIG. 1). The fan 50 is mounted on the first opening 301 of the first shroud 31. A second opening 32 is formed at the other opposite side of the first shroud 31. A coupling element 33 is provided at either side of the second opening 32. In the embodiment, the coupling element 33 is a U-shaped groove. A snapping element 34 is formed at either corner of the first shroud 31 above the coupling element 33 being perpendicular to the second opening 32. In the embodiment, the snapping element 34. is a wing member. A plurality of ribs 35 are provided across the second opening 32 to form a plurality of first channels 36. It is envisaged that the first channels 36 formed by the ribs 35 can concentrate air current in the first shroud 31. As a result, an air current generated by the fan 50 at one side of the first shroud 31 can be guided through the first channels 36 for increasing a flow rate.

In the invention, the device 30 further comprises a bell-shaped second shroud 40 having a first opening 41 at one side (FIG. 1). A diameter of the first opening 41 is smaller than that of the second opening 32 of the first shroud 31. The second shroud 40 comprises a mating coupling element 42 and a mating snapping element 43 both at either side. In embodiment, the mating coupling element 42 is a projection and the mating snapping element 43 is a flexible arm. The mating snapping element 43 has a wedge 431 for facilitating a fastening of the mating coupling element 42 and the mating snapping element 43 onto the coupling element 33 and the snapping element 34 at the second opening 32 of the first shroud 31 respectively. As stated above, the diameter of the second opening 32 of the first shroud 31 is larger than that of the first opening 41 of the second shroud 40. As such, an upper air passage in communication with outside is formed by upper ones of the first channels 36 at the second opening 32 and the second shroud 40 as the second shroud 40 and the first shroud 31 are assembled. Further, a lower air passage in communication with outside is formed by lower ones of the first channels 36 at the second opening 32 and the second shroud 40.

In the invention, a plurality of ribs 45 are provided across the second shroud 40 to form a plurality of second channels 46. The ribs 45 are disposed corresponding to the ribs 35 in the second opening 32 of the first shroud 31. As stated above, the first and the second channels 36 and 46 are formed by the ribs 35 and 45 respectively. Also, the second channels 46 can concentrate air current in the second shroud 40. As a result, an air current generated by the fan 50 can be guided through the second channels 46 for increasing a flow rate. Moreover, an L-shaped frame element 47 is extended outward from a second opening 44 at the other opposite side of the second shroud 40.

A structure and operation of the assembled components of the invention and other associated elements will now be described. The first opening 301 of the first shroud 31 having the fan 50 mounted thereon is coupled to the vent opening 101 on the housing 10. The first opening 41 of the second shroud 40 is coupled to the second opening 32 of the first shroud 31 by fastening the mating coupling elements 42 and the mating snapping elements 43 onto the coupling elements 33 and the snapping elements 34 at the second opening 32 of the first shroud 31 respectively. As an end, an upper air passage and a lower air passage are formed (FIGS. 2 and 3). Also, the L-shaped frame element 47 adjacent the second channels 46 of the second shroud 40 can partially enclose fins 21 on one side of the CPU 20 (FIG. 3). As such, a flow rate of air current generated by the fan 50 can be increased in the first shroud 31. And in turn, the air current can flow through the upper and lower air passages in which the air current flowed through the upper air passage can cool the fins 21 of the CPU 20 and the air current flowed through the lower air passage can cool electronic elements (not shown) of computer around the CPU 20. Such double arrangement of the upper and lower air passages can significantly increase a cooling effect of the CPU and the other electronic elements. This is advantageous over the prior art.

What is claimed is:

1. A wind guide device for a cooling fan mounted on a CPU of a computer comprising:

a first shroud including a first opening at one side, a second opening an opposite side, a coupling element at either side of the second opening, and a snapping element at either corner of the first shroud, the snapping element being above the coupling element and perpendicular to the second opening; and a second shroud including a first opening at one side, the first opening having a diameter smaller than that of the second opening of the first shroud, a second opening at an opposite side, a mating coupling element at either side, a mating snapping element at either side wherein the mating coupling elements and the mating snapping elements are fastened onto the coupling elements and the snapping elements at the second opening of the first shroud respectively, and an L-shaped frame element extended outward from the second opening of the second shroud;

wherein the first opening of the first shroud having the fan mounted thereon is coupled to a vent opening on a housing of the computer, the first opening of the second shroud is coupled to the second opening of the first shroud by fastening the mating coupling elements and the mating snapping elements of the second shroud onto the coupling elements and the snapping elements at the second opening of the first shroud respectively for forming an upper air passage and a lower air passage, and fins on one side of the CPU are partially enclosed by the L-shaped frame element of the second shroud so as to cause an air current generated by the fan to accelerate through the upper and lower air passages for cooling the CPU and other electronic elements therearound.

2. The wind guide device of claim 1, wherein each of the coupling elements is a U-shaped groove.

3. The wind guide device of claim 1, wherein each of the snapping elements is a wing member.

4. The wind guide device of claim 1, wherein the first shroud further comprises a plurality of rib members across the second opening thereof to form a plurality of first channels for concentrating the air current in the first shroud and guiding and hastening the air current generated by the fan at one side of the first shroud therethrough.

5. The wind guide device of claim 1, wherein the first shroud has a substantially square section.

6. The wind guide device of claim 1, wherein each of the mating coupling elements is a projection.

7. The wind guide device of claim 1, wherein each of the mating snapping elements is a flexible arm having a wedge.

8. The wind guide device of claim 1, wherein the second shroud further comprises a plurality of ribs across the second opening thereof to form a plurality of second channels, the ribs being disposed corresponding to the rib members in the second opening of the first shroud.

9. The wind guide device of claim 1, wherein the second shroud is shaped substantially as a bell.

* * * * *